United States Patent
Kojima et al.

(10) Patent No.: US 6,182,263 B1
(45) Date of Patent: *Jan. 30, 2001

(54) APPARATUS FOR GENERATING, RECORDING AND TRANSMITTING AN ERROR PRODUCT CODE BLOCK HAVING AN IMPROVED CHECK CODE ARRANGEMENT

(75) Inventors: Tadashi Kojima; Koichi Hirayama, both of Yokohama; Yoshihisa Fukushima, Osaka; Takashi Yumiba, Uji, all of (JP)

(73) Assignee: Kabushiki Kaisha Toshiba, Kawasaki (JP)

( * ) Notice: Under 35 U.S.C. 154(b), the term of this patent shall be extended for 0 days.

This patent is subject to a terminal disclaimer.

(21) Appl. No.: 09/121,302

(22) Filed: Jul. 23, 1998

Related U.S. Application Data

(62) Division of application No. 08/631,426, filed on Apr. 12, 1996, now Pat. No. 5,790,569.

(30) Foreign Application Priority Data

Apr. 12, 1995 (JP) .................................................. 7-086874

(51) Int. Cl.[7] .................................................. G11C 29/00
(52) U.S. Cl. .......................... 714/769; 714/750; 714/752; 714/755; 714/756; 714/761; 714/762; 714/763; 714/701; 714/820; 714/821
(58) Field of Search .................................... 714/769, 755, 714/756, 752, 750, 763, 762, 761, 751, 821, 6, 701, 748, 820, 222

(56) References Cited

U.S. PATENT DOCUMENTS

| 4,413,340 | * | 11/1983 | Odaka et al. | 714/761 |
| 5,241,546 | * | 8/1993 | Peterson et al. | 714/761 |
| 5,450,421 | * | 9/1995 | Joo et al. | 714/756 |
| 5,790,569 | * | 8/1998 | Kojima et al. | 714/755 |
| 6,055,646 | * | 4/2000 | Uchihori et al. | 714/6 |

FOREIGN PATENT DOCUMENTS 63-23274    7/1986    (JP) .

OTHER PUBLICATIONS

Pyndiah et al., "Near optimum decoding of product codes", The Global Bridge., IEEE, pp. 339–343 vol. 1, 1994.*

* cited by examiner

*Primary Examiner*—William Grant
*Assistant Examiner*—McDieunel Marc
(74) *Attorney, Agent, or Firm*—Pillsbury Madison & Sutro Intellectual Property

(57) ABSTRACT

There is provided an apparatus for processing data for generating an error correction product code block devised so as to maintain the current level of redundancy after the error correcting ability is modified as a result of advancement of semiconductor and data recording/transmission technologies. Unlike any known technique of configuring a Reed-Solomon error correcting product code block of $(M+P0) \times (N+PI)$ bytes for an information data of $(M \times N)$ bytes, an error correcting product code block data structure is obtained by configuring a $(K \times (M+1) \times (N+P))$-byte Reed-Solomon error correcting product code block for $(K \times M \times N)$-byte data, making K variable to consequently make the entire size of the Reed-Solomon error correcting product code block variable. At the same time, the error correcting ability varies in proportion to the value of K without increasing redundancy.

1 Claim, 4 Drawing Sheets

SECTOR CONFIGURATION    | 4 |

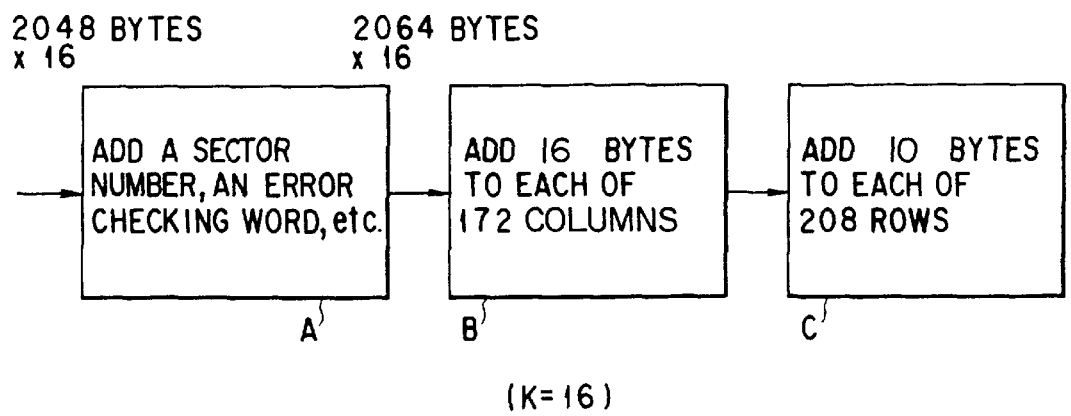
F I G. 2

APPARATUS FOR GENERATING, RECORDING AND TRANSMITTING AN ERROR PRODUCT CODE BLOCK HAVING AN IMPROVED CHECK CODE ARRANGEMENT

This is a Division of application Ser. No. 08/631,426 filed Apr. 12, 1996 and issued as U.S. Pat. No. 5,790,569 on Aug. 4, 1998.

BACKGROUND OF THE INVENTION

1. Field of the Invention

This invention relates to a method of configuring an error correcting product code block adapted for use for digital data recording/transmission and, more particularly, it relates to a method of processing data for generating an error correcting product code block devised so as not to change the level of redundancy after the error correcting ability is modified. The present invention also relates to a method of processing data for recording such data on a recording medium as well as to an apparatus for processing such data.

2. Description of the Related Art

In a system for recording digital data by using byte unit, which is equal to eight bits, data are processed by configuring Reed-Solomon error correcting product code blocks. More specifically, after arranging data of (M×N) bytes in M rows×N columns, a P0-byte error correcting check word is added to the N-byte information section of each column and then a PI-byte error correcting check word is added to the N-byte information section of each row to produce a Reed-Solomon error correcting product code block comprising (M+P0) rows×(N+PI) columns. Then, random errors and burst errors can be efficiently corrected on the data reproducing side or the data receiving side by means of the Reed-Solomon error correcting product code blocks that are recorded and transmitted.

A Reed-Solomon error correcting product code block as described above operates efficiently when the redundancy is large or the ratio of the redundant section of the error correcting check word (PI×M+P0×N+PI×P0) to the entire code word (M+P0)×(N+PI) is small. On the other hand, its error correcting ability is raised for both random errors and burst errors when large values are used for PI and P0.

It is known that, when different Reed-Solomon error correcting product code blocks having a same level of redundancy are compared, those having small M, N, PI and P0 are poorly adapted for error correcting because the probability of occurrence of error correction rises with such code blocks.

On the other hand, while it is also known that the error correcting ability of a Reed-Solomon error correcting product code block is raised by increasing the values of M and N because the values of PI and P0 are also increased accordingly, if the redundancy is held to a same level, such high error correcting ability cannot be realized without satisfying requirements as will be described below.

Firstly, in terms of a code word length that allows a Reed-Solomon code word to be configured, M+P0 and N+PI have to be equal to or less than 255 bytes.

Secondly, there is a hardware cost restriction to be observed. Specifically, it is expressed typically in terms of the cost of the operational circuit and that of the memory for storing the entire code word or (M+P0)×(N+PI) bytes. Since the cost of a memory can change with the development of semiconductor technology, it is highly desirable to make the above described parameters of M, N, PI and P0 of Reed-Solomon error correcting product code block variable as a function of the advancement of semiconductor technology and, particularly, the reduction in the cost of a memory.

This is because a same error in a physical length or a time length is translated into a larger burst of error bytes as the density in which data are recorded on a medium or the rate at which data are transmitted through a transmission path is raised in accordance with the advancement of semiconductor technology, so that a higher error correcting ability becomes necessary.

Conventionally, however, a Reed-Solomon error correcting product code block having (M+P0)×(N+PI) bytes is configured for a given data of (M×N) bytes so that redundancy is automatically set as a function of the entire size of the product code block. In other words, any attempt for maintaining a given level of error correcting ability is accompanied by a problem of invariable block size.

However, as a higher recording density and a higher transmission rate are expected with the advancement of semiconductor technology in the future, a much higher level of error correcting ability will be required for an error correcting product code block of a given size. This in turn requires the use of a large error correcting check word, which entails an enhanced level of redundancy if conventional technology is used.

SUMMARY OF THE INVENTION

It is, therefore, an object of the present to provide a method of processing data for generating an error correcting product code block devised so as to maintain the current level of redundancy after the error correcting ability is improved as a result of advancement of the semiconductor and data recording/transmission technologies. It is another object of the present invention to provide a method of processing data for recording such data on a recording medium as well as to an apparatus for processing such data.

According to the invention, the above objects are achieved by providing an error correcting product code block data structure obtained by configuring a (K×(M+1)×(N+P))-byte Reed-Solomon error correcting product code block for (K×M×N)-byte data and making K variable to consequently make the entire size of the Reed-Solomon error correcting product code block variable and, at the same time, making the error correcting ability variable in proportion to the value of K.

More specifically, there is provided a method of generating an error correcting product code block comprising:

a first step of processing digital data on a byte by byte basis to configure an information data block out of bytes of M rows×N columns (M×N bytes), arranging data on a byte by byte basis in the information data block and arranging data in each row sequentially from the 0th to the (N−1)-th column according to the sequence of data transmission and sequentially from the 0th to the (M−1)-th row according to the sequence of data transmission;

a second step of arranging a matrix block of (K×M) rows×N columns by using K information data blocks arranged sequentially according to the sequence of data transmission;

a third step of adding an error correcting check word of K bytes to each column of (K×M) bytes of the matrix block to turn each of M rows into a Reed-Solomon code word C2 of (K×(M+1)) bytes; and a fourth step of adding an error correcting check word of P bytes to each row of N bytes to turn each of the (K×(M+1)) rows into a Reed-Solomon code word C1 of (N+P) bytes;

the error correcting product code block being a Reed-Solomon error correcting product code block of (K×(M+1)×(N+P)) bytes having an information section of K information data blocks of (K×M×N) bytes, the sum of (M×N) bytes of an information data block and the average number of bytes of a check word added thereto being held to a constant value of (M+1)×(N+P) bytes.

With the above method, the sum of (M×N) bytes of an information data block and the average number of bytes of a check word added thereto is held to a constant value of (M+1)×(N+P) that is not dependent on the number of information data blocks, or K, of the error correcting product code block and hence the level of redundancy of the (M+1)×(N+P) bytes remains invariable.

According to the invention, there are also provided a method of processing data for recording such an error correcting product code block, a recording medium for recording such an error correcting product code block and a telecommunication apparatus for transmitting such an error correcting product code block.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a block diagram showing the procedure of generating a Reed-Solomon error correcting product code block according to an embodiment of the invention;

DETAILED DESCRIPTION OF THE PREFERRED EMBODIMENTS

Now, the present invention will be described by referring to the accompanying drawings that illustrate preferred embodiments of the invention.

Figure 1:
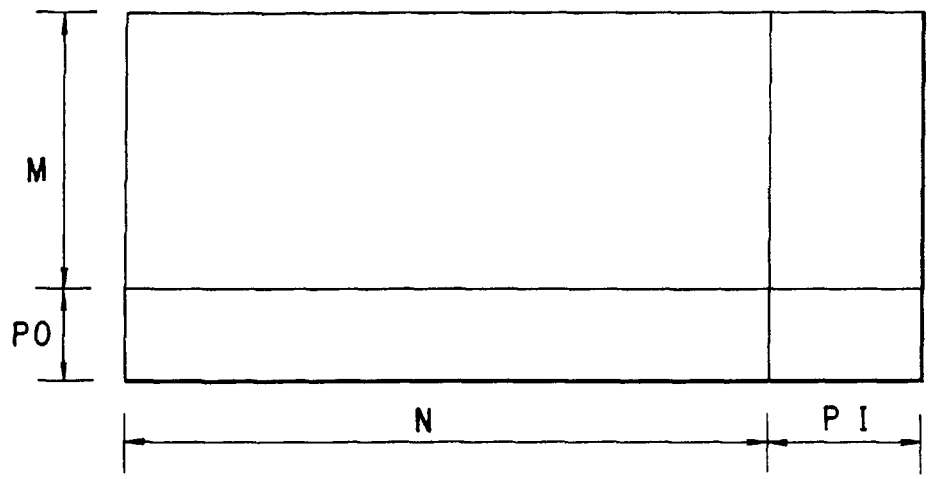
FIG. 1 is an illustration showing the configuration of a known Reed-Solomon error correcting product code block.

FIG. 1 is an illustration showing the configuration of a known Reed-Solomon error correcting product code block. With this known format, as described earlier, a Reed-Solomon error correcting product code block of (M+P0)×(N+PI) bytes is configured for information data of (M×N) bytes. Therefore, the level of redundancy and the size of the entire block are closely tied to each other, so that the size of the block cannot be arbitrarily changed without modifying the error correcting ability. In other words, the level of redundancy is inevitably and undesirably raised if a large error correcting check word is used.

Contrary to this, according to the invention, a Reed-Solomon error correcting product code block is configured in a manner as illustrated in FIG. 2.

In a first embodiment, which will be described hereinafter, values of K=16, M=12, N=172 and P=10 are selected for recording a data of 2,048 bytes in a sector of a recording medium, which may preferably be an optical disc.

In this embodiment, P=10 bytes is selected for code word C1 and K=16 bytes is selected for cord word C2 as the number of bytes of an error correcting check word in view of the fact that 1 an even number is more efficient than an odd number for a same error correcting ability, 2 that a required level of burst error correcting ability cannot be maintained for K=16 rows if P=8 bytes or less because of a rise in the probability of error correction, and 3 that a relationship of K>P is required to raise the level of burst error correcting ability for a same level of redundancy. Additionally, values of M=12 and N=172 are selected in view of the fact that the size of a sector has to be slightly larger than 2,048 bytes because a sector number and an error detecting word have to be added to recorded data of 2,048 bytes for each sector.

Figure 3:
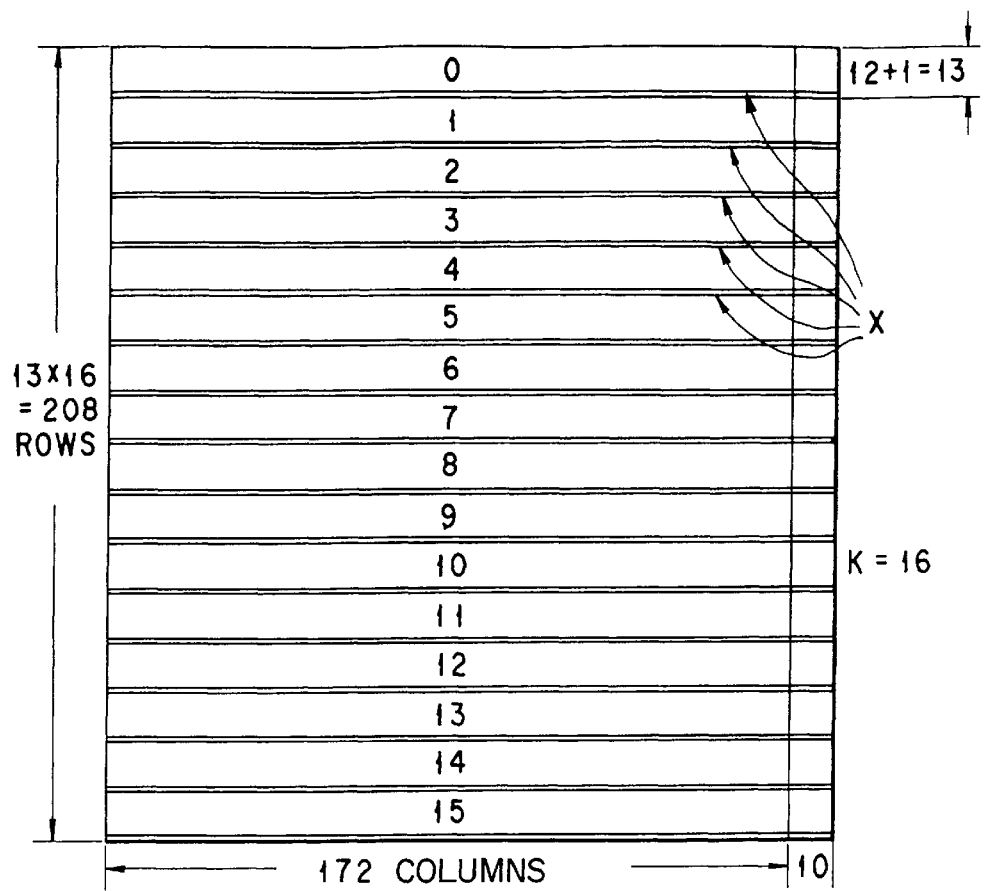
FIG. 3 is an illustration showing the configuration of a Reed-Solomon error correcting product code block generated by the procedure of FIG. 2.

FIG. 2 is a block diagram showing the procedure of generating a Reed-Solomon error correcting product code block by using a unit of 16 sectors. FIG. 3 is an illustration showing the row configuration of a Reed-Solomon error correcting product code block in a sector.

Referring to block A through C of FIG. 2, in the first step, digital data is processed on a byte by byte basis to form an information data block with (M×N) bytes of M (=12) rows×N (=172) columns and data are arranged on a byte by byte basis in the information data block, while data are arranged sequentially in each row from the 0th to the (N−1)-th column according to the sequence of data transmission and sequentially from the 0th to the (M−1)-th row according to the sequence of data transmission.

Then, in the second step, a matrix block of (K×M) rows×N columns is arranged by using K (=16) information data blocks, each having a configuration as described above.

Subsequently, in the third step, an error correcting check word of K (=16) bytes is added to each column of (K×M) bytes of the matrix block to turn each of N column into a Reed-Solomon code word C2 of (K×(M+1)) bytes.

Finally, in the fourth step, an error correcting check word of P (=10) bytes is added to each row of N bytes to turn each of the (K×(M+1)) rows into a Reed-Solomon code word C1 of (N+P) bytes.

The entire error correcting product code block is a Reed-Solomon error correcting product code block of (K×(M+1)×(N+P)) bytes having an information section of K information data blocks of (K×M×N) bytes. The sum of (M×N) bytes of an information data block and the average number of bytes of a check word added thereto is held to a constant value of (M+1)×(N+P) bytes.

This embodiment will be described further by referring to FIGS. 2, 3 and 4.

Data to be recorded is taken in 2,048 bytes at a time for a sector, to which a sector number and an error detecting word (16 bytes) are added to the sector to make the total number of bytes equal to 2,064. (See block A of FIG. 2.) As shown in FIG. 4, a total of 16 bytes is used for a sector number (ID; sector identification), an ID error correcting word (IEC), a system reservation code (RSV) and an error detecting code (EDC).

The 2,064 bytes are assigned to a sector of a Reed-Solomon error correcting product code block and stored in a storage area of M rows×N columns=12 rows×172 columns=2,064 bytes obtained by subtracting the storage area for an error correcting check word from the overall storage area of a sector of (M+1) rows×(N+P) columns=13 rows×182 columns.

In this way, the data is sequentially stored into K=16 sectors of memory.

After storing a data of 192 rows×172 columns in K=16 sectors, each of the 172 columns are processed to produce a Reed-Solomon code word C2 of (192+16) bytes to fill the 16 void rows, each of which is arranged every 12 rows (as indicated by X in FIG. 3). (See block B of FIG. 2.)

The relationship between the 16 rows to be filled with Reed-Solomon code words and the degree of the Reed-Solomon code word C2 is determined in advance such that the positions of the 16 rows and the degree show a one-to-one correspondence or the former correspond to a lower degree side of the 15th down to the 0th.

After filling the 16 void rows (X), an error correcting check word of 10 bytes is added to each row of the matrix of 208 rows×172 columns to form a (172+10)-byte Reed-Solomon code word C1 for each of the 208 rows. Thus, a Reed-Solomon error correcting product code block is formed as shown in FIG. 3 by using a unit of 16 sectors. (See block C of FIG. 2.)

The block has a size of 208 rows×182 columns=37,856 bytes that can be optimally stored with a generous margin in a memory device that is currently commercially available at low cost.

The redundancy of a Reed-Solomon error correcting product code block realized by using a unit of 16 sectors is equal to $$(208 \times 182 - 192 \times 172)/(208 \times 182) = 12.76\%$$

while a correctable burst error has a maximum length that can be obtained on the basis of the number of rows corresponding to the number of error correcting check words C2, or 16 rows×182 columns=2,912 bytes.

As a correctable burst error has a maximum length that can be obtained on the basis of the number of rows corresponding to the number of error correcting check words C2, the error correcting ability can be improved by increasing the number of rows and that of error correcting check words C2 of a Reed-Solomon error correcting product code block.

Figure 4:
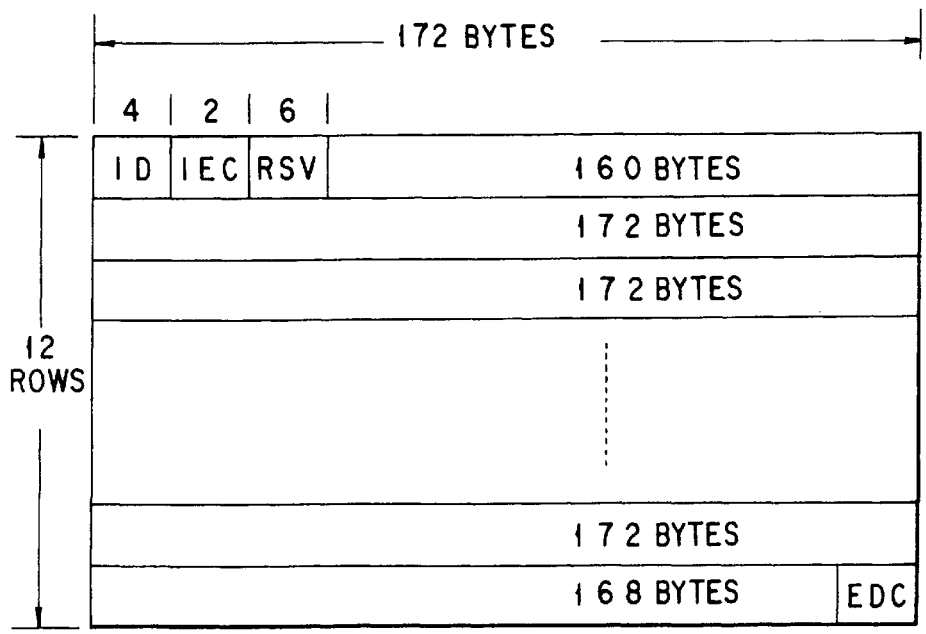
FIG. 4 is an illustration showing the configuration of sectors of a Reed-Solomon error correcting product code block generated by a method according to the invention.

Thus, the level of redundancy can be maintained to a constant level with the above described method of the present invention because the information data is always allocated to the sectors in a manner as illustrated in FIG. 4.

Situations where the number of rows and that of error correcting check words have to be increased for a Reed-Solomon error correcting product code block may include those in which the error correcting ability has to be raised and those in which the recording density per given length of the tracks of an optical disk as a result of advancement of the semiconductor and data recording/transmission technologies has increased. If such is the case, the number of error correcting check words C2 can be increased by increasing the number of rows of the block. For reproducing the stored information, the stored pieces of information are sequentially picked up along the rows of the block and, with the above described method of the present invention, a same level of redundancy can be maintained if the stored Reed-Solomon error correcting product code block is taken up for error correction.

While a figure of K=16 is used in the above description, it may be needless to say that K=12 may be selected depending on the memory size. Then, a less costly memory device may be used for the purpose of the invention since the size of block is 28,392 byte which can be stored in 256 Kbit capacity.

Figure 5:
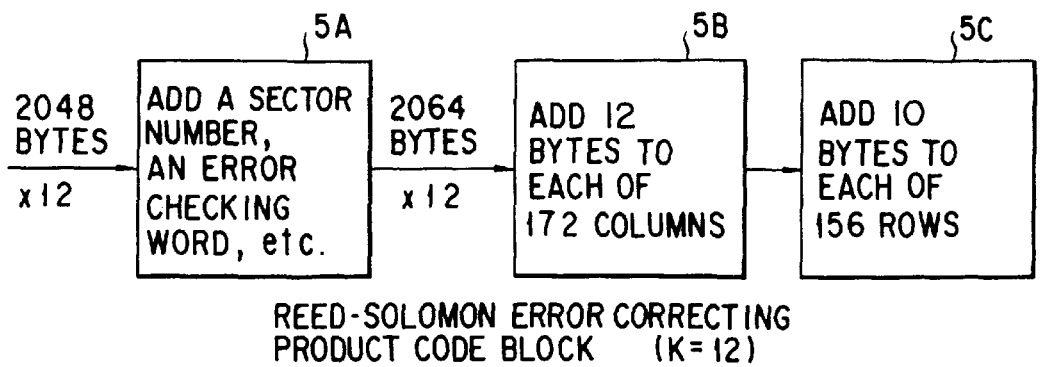
FIG. 5 is a block diagram showing the procedure of generating a Reed-Solomon error correcting product code block according to another embodiment of the invention.

FIG. 5 is a block diagram showing the procedure of generating a Reed-Solomon error correcting product code block according to a second embodiment of the invention. Note that K=12 in this embodiment. Blocks 5A, 5B and 5C of FIG. 5 correspond to blocks A, B and C in FIG. 2 respectively.

Figure 6:
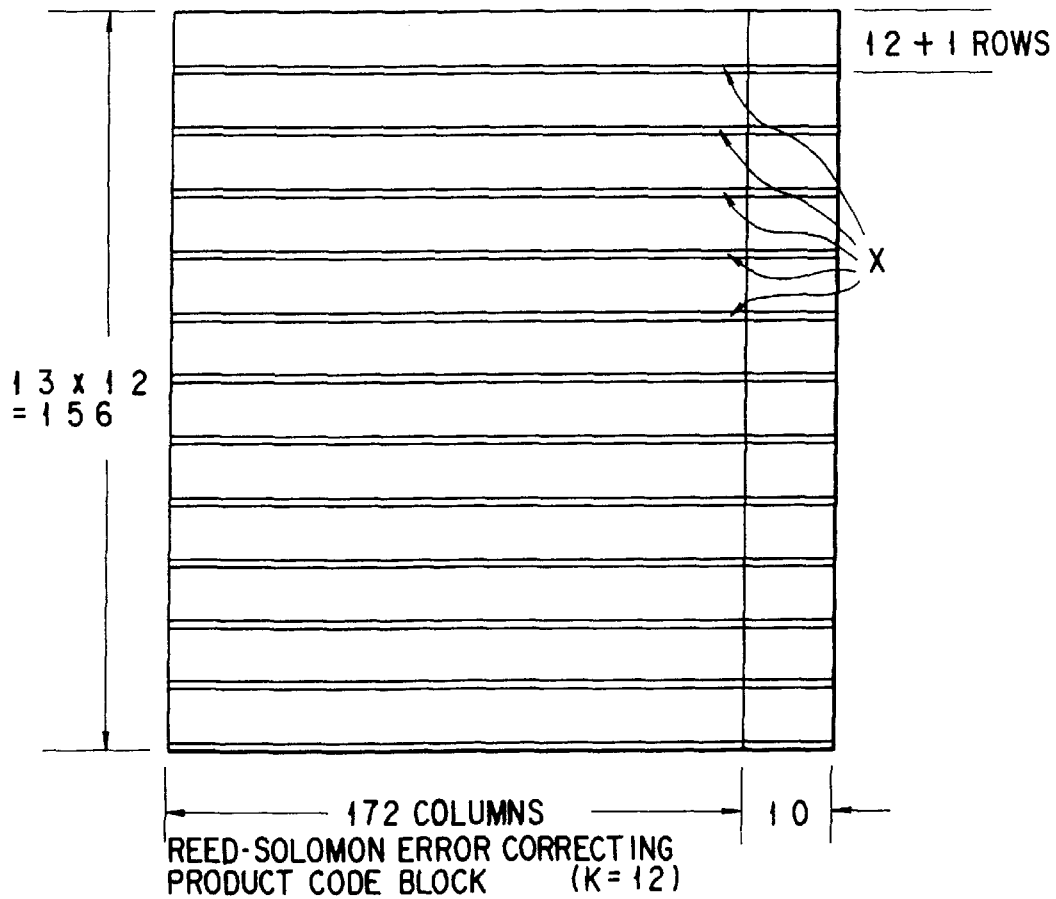
FIG. 6 is an illustration showing the configuration of a Reed-Solomon error correcting product code block generated by the procedure of FIG. 5.

FIG. 6 is an illustration showing the configuration of a Reed-Solomon error correcting product code block generated by the procedure of FIG. 5.

Figure 7:
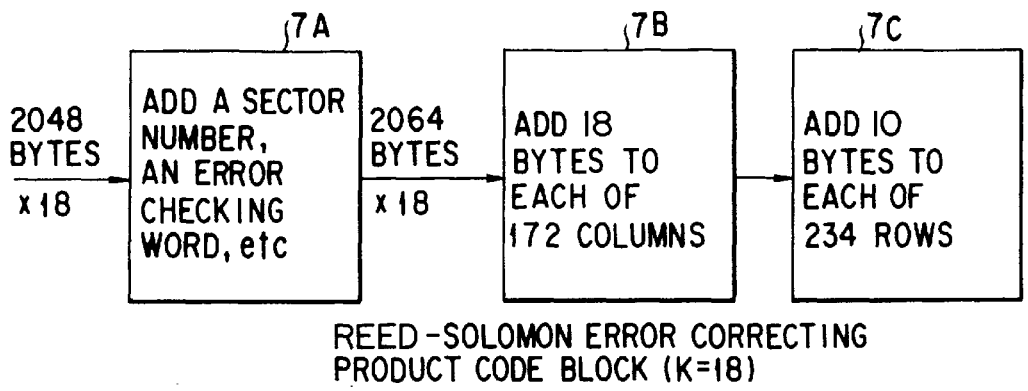
FIG. 7 is a block diagram showing the procedure of generating a Reed-Solomon error correcting product code block according to still another embodiment of the invention.

FIG. 7 is a block diagram showing the procedure of generating a Reed-Solomon error correcting product code block according to a third embodiment of the invention.

Figure 8:
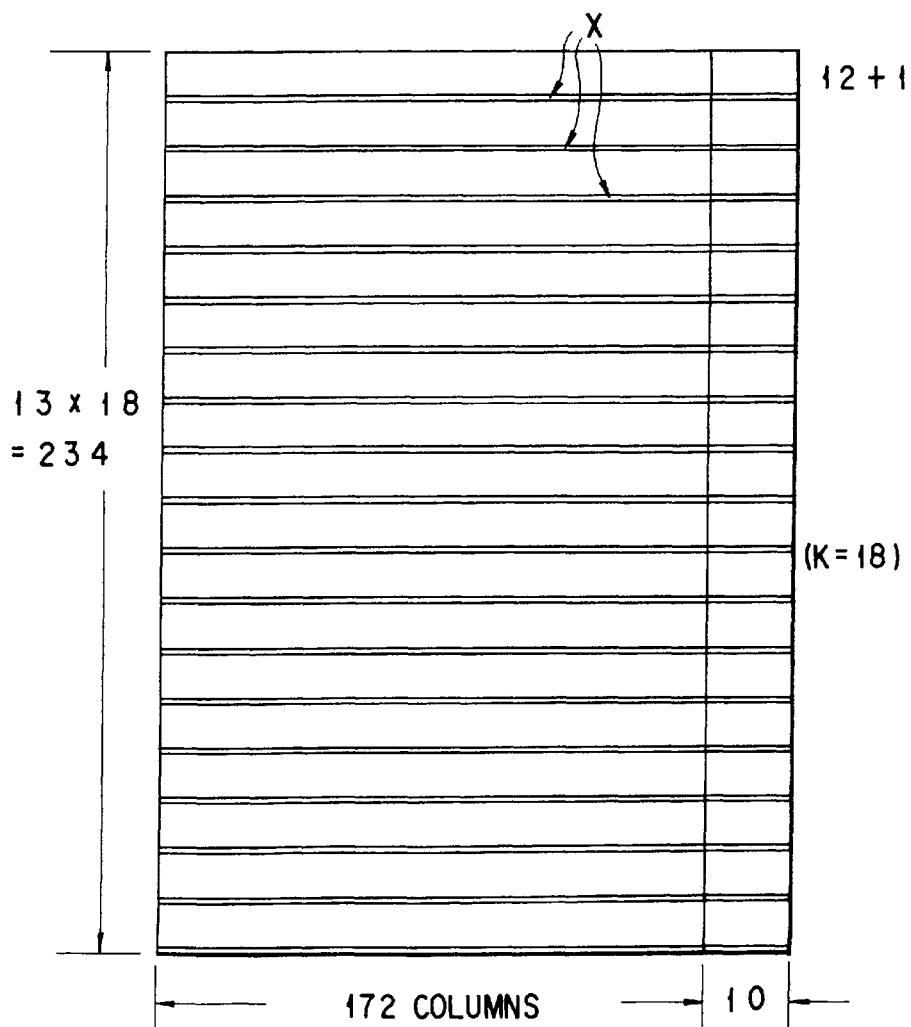
FIG. 8 is an illustration showing the configuration of a Reed-Solomon error correcting product code block generated by the procedure of FIG. 7.

FIG. 8 is an illustration showing the configuration of a Reed-Solomon error correcting product code block generated by the procedure of FIG. 7.

As shown, data to be recorded is taken in 2,048 bytes at a time for a sector, to which a sector number and an error detecting word (16 bytes) are added for the sector to make the total number of bytes equal to 2,064. (See block 7A of FIG. 7.) The 2,064 bytes are assigned to a sector of a Reed-Solomon error correcting product code block and stored in the storage area of M rows×N columns=12 rows× 172 columns=2,064 bytes obtained by subtracting the storage area for an error correcting check word from the overall storage area of a sector of (M+1) rows×(N+P) columns=13 rows×182 columns.

In this way, the data is sequentially stored into K=18 sectors of memory.

After storing data of 216 rows×172 columns in K=18 sectors, each of the 172 columns are processed to produce a Reed-Solomon code word C2 of (216+18) bytes to fill the 18 void rows, each of which is arranged every 12 rows (as indicated by X in FIG. 8). (See block 7B of FIG. 7.)

After filling the 18 void rows (X), an error correcting check word of 10 bytes is added to each row of the matrix of 234 rows×172 columns to form a (172+10)-byte Reed-Solomon code word C1 for each of the 234 columns. Thus, a Reed-Solomon error correcting product code block is formed as shown in FIG. 8 by using a unit of 18 sectors. (See block 7C of FIG. 7.)

This embodiment can raise the error correcting ability relative to the preceding embodiments, although the level of redundancy remains same.

As described above in detail, there is provided a method of processing data for generating an error correcting product code block devised so as to maintain the current level of redundancy after the error correcting ability is improved as a result of advancement of the technologies of semiconductor and data recording/transmission.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An optical disk reproducing apparatus being constructed and arranged to reproduce data from an optical disk having an error correcting product code block recorded thereon, and the optical disk reproducing apparatus being constructed and arranged to execute error correction processing with respect to the reproduced data, the optical disk reproducing apparatus comprising:

means for processing digital data on a byte by byte basis to configure an information data block of (M×N) bytes of M rows×N columns;

means for permitting data to exist on the byte by byte basis in the information data block and permitting the data in each row to exist sequentially from a $0^{th}$ to a (N−1)-th column according to a sequence of data transmission and sequentially from a $0^{th}$ to a (M−1)-th row according to the sequence of data transmission;

means for permitting a matrix block of (K×M) rows×N columns to exist, the matrix block including K of the information data blocks arranged sequentially according to the sequence of data transmission;

means for adding a first error correcting check word of K bytes to each column of (K×M) bytes of the matrix block to turn each of the N columns into a Reed-Solomon code word C2 of (K×(M+1)) bytes, the error correcting check word of K bytes existing on a byte by byte basis at a position corresponding to every M bytes of information data; and means for adding a second error correcting check word of P bytes to each row of N bytes to turn each of the (K×(M+1)) rows into a Reed-Solomon code word C1 of (N+P) bytes, wherein:

the error correcting product code block is a Reed-Solomon error correcting product code block of (K×(M+1)×(N+P)) bytes having an information section of K of the information data blocks of (K×M×N) bytes, and a sum of (M×N) bytes of an information data block and an average number of bytes of a check word added thereto are held to a constant value of (M+1)×(N+P) bytes.

* * * * *